United States Patent [19]

Balooch et al.

[11] Patent Number: 5,019,552

[45] Date of Patent: May 28, 1991

[54] LONG-LASER-PULSE METHOD OF PRODUCING THIN FILMS

[75] Inventors: Mehdi Balooch; Donald K. Olander, both of Berkeley; Richard E. Russo, Walnut Creek, all of Calif.

[73] Assignee: The United States of America as represented by the United States Department of Energy, Washington, D.C.

[21] Appl. No.: 482,131

[22] Filed: Feb. 20, 1990

[51] Int. Cl.$^5$ .......................... B05D 3/06; B05D 5/12
[52] U.S. Cl. .......................... 505/1; 505/732; 505/730; 427/62; 427/53.1; 427/54.1; 427/314
[58] Field of Search .......................... 505/1, 730, 732; 427/62, 63, 53.1, 54.1, 314

[56] References Cited

PUBLICATIONS

Inam et al., "As-Deposited High Tc and Jc Superconducting Thin Films Made at Low Temperatures", Appl. Phys. Lett. 53(10), Sep. 1988, pp. 908–910.
Koren et al., "Role of Atomic Oxygen in the Low-Temperature Growth of $YBa_2Cu_3O_{7-8}$ Thin Films by Laser Ablation Deposition", Appl. Phys. Lett. 54 (19), May 1989, pp. 1920–1922.
Witanachchi et al., "Deposition of Superconducting Y–Ba–Cu–O Films at 400° C. without Post-Annealing", Appl. Phys. Lett. 53(3), Jul. 1988, pp. 234–236.
Narayan et al., "Formation of Thin Superconducting Films by the Laser Processing Method", Appl. Phys. Lett. 5(22), Nov. 1987, p. 1845–1847.
Radousky et al., "Metallization and Superconducting Properties of $Yba_2Cu_3O_{6.2}Br_y$", Lawrence Livermore National Laboratory UCL-102234, Oct. 1989.
Venkatesan et al., (1), "Observation of Two Distinct Components During Pulsed Laser Deposition of High $T_c$ Superconducting . . . ", Appl. Phys. Ltrs., 52(14), Apr. 4, 1988, pp. 1193–1195.
Venkatesan et al., (2), "Nature of the Pulsed Laser Process for the Deposition . . . ", Appl. Phys. Ltrs., 53(15), Oct. 10, 1988, pp. 1431–1433.
Zheng et al., "Generation of High-Energy Atomic Beams in Laser-Superconducting Target Interactions", Appl. Phys. Ltrs., 54(3), Jan. 16, 1989. pp. 280–282.
Ready, "Effects Due to Absorption of Laser Radiation", Journ. of Appl. Phys., 36(2), Feb. 1965, pp. 462–468.
"Y–Ba–Cu–O Superconducting Films . . . ", Balooch et al., Appl. Phy. Lett., 55(2):197–199 (Jul. 10, 1989).
"Long-Laser Pulse Method for Producing Y–Ba–Cu–O Superconducting Films", Balooch et al., Mat. Res. Soc. Symp., (Nov. 1989).
"Preparation of High $T_c$. . . ", DeSantolo et al., Appl. Phys. Lett., 52(23):1995–1997 (Jun. 6, 1988).
"Superconductivity in Bulk and Thin Films of . . . ", Moorjani et al., Phys. Rev. (Sep. 1, 1987).
"Laser Induced Deposition . . . ", Kwok et al., Mat. Res. Soc. Symp., 99:273–277 (1988).
"Laser Evaporation Deposition of Superconducting . . . ", Kwok et al., Appl. Phys., 52(21):1825–1827 (Mar. 30, 1988).
"High $T_c$ Superconducting Thin Films . . . ", Lynds et al., Amer. Inst. of Phys., 159–160 (Nov. 6, 1987).
"Highly Oriented As-Deposited Superconducting Laser . . . ", Appl. Phys., 53(23):2330–2332 (Dec. 5, 1988).
"Laser Induced Deposition of . . . ", Kwok et al., Mat. Res. Soc. Symp. Proc., 99:735–737 (1988).
"Laser-Pulse Vaporation of Uranium Dioxide . . . ", Olander et al., *J. Appl. Phys.*, 64(5):2680–2695, 9/1/88.
"Laser-Pulse Vaporization of Uranium Carbide", Tehranian et al., *High Temperature Science*, 25:55–75, 1988.

Primary Examiner—Norman Morgenstern
Assistant Examiner—Roy V. King
Attorney, Agent, or Firm—L. E. Carnahan; Roger S. Gaither; William R. Moser

[57] ABSTRACT

A method of depositing thin films by means of laser vaporization employs a long-pulse laser (Nd-glass of about one millisecond duration) with a peak power density typically in the range $10^5$–$10^6$ W/cm$^2$. The method may be used to produce high $T_c$ superconducting films of perovskite material. In one embodiment, a few hundred nanometers thick film of $YBa_2Cu_3O_{7-x}$ is produced on a $SrTiO_3$ crystal substrate in one or two pulses. In situ-recrystallization and post-annealing, both at elevated temperature and in the presence of an oxidizing agent help to improve film quality. The film thickness exhibits a $\cos\theta$ dependence with the vapor emission angle, and the film composition is independent of this angle.

25 Claims, 3 Drawing Sheets

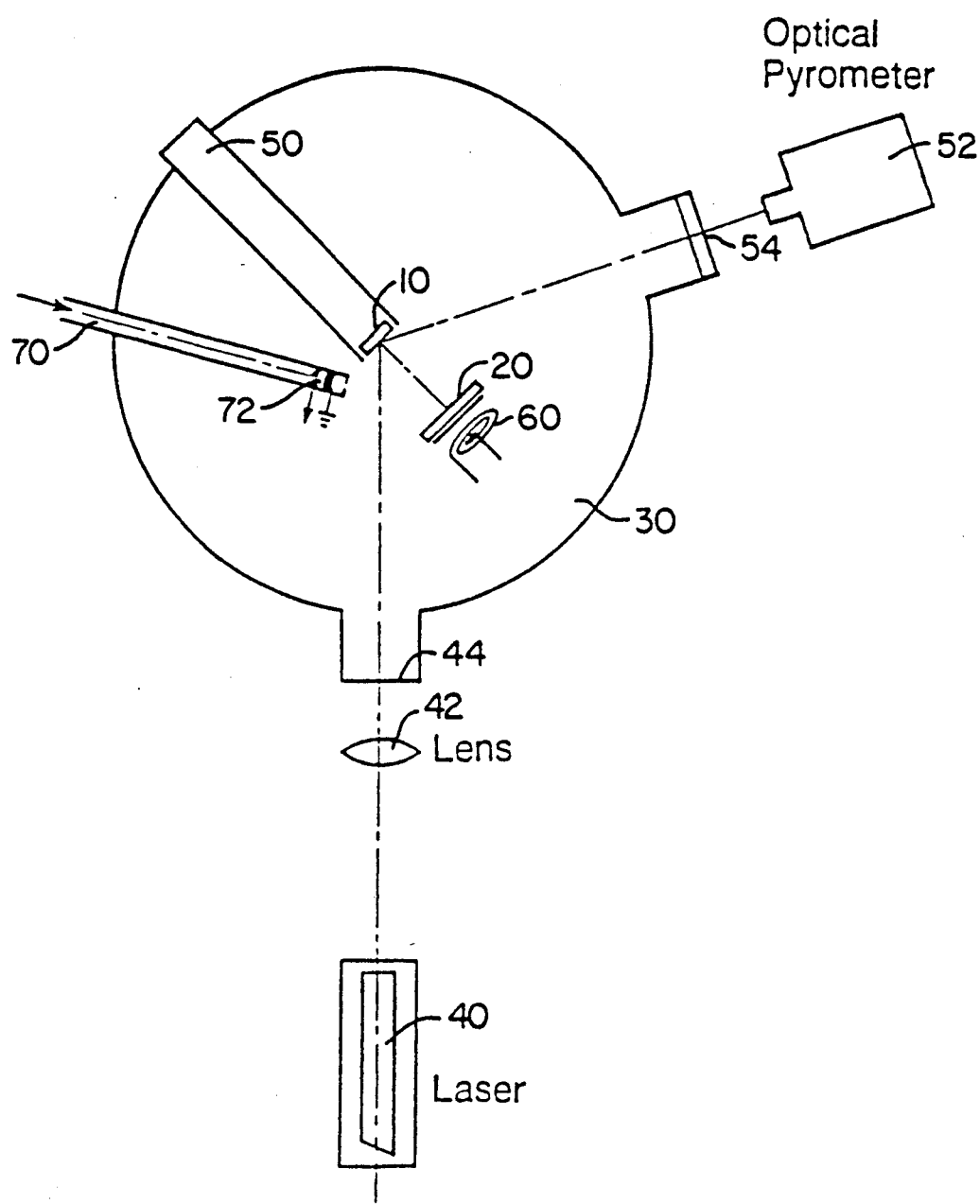
FIG._1.

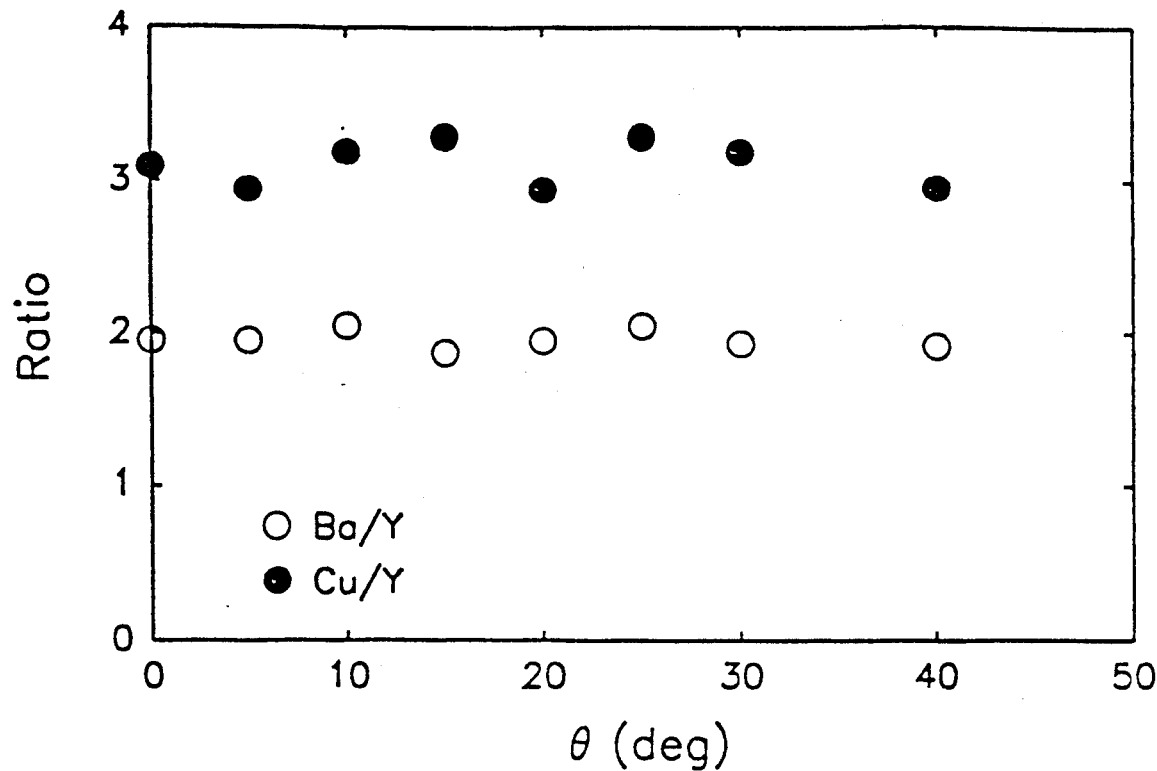
FIG._5.
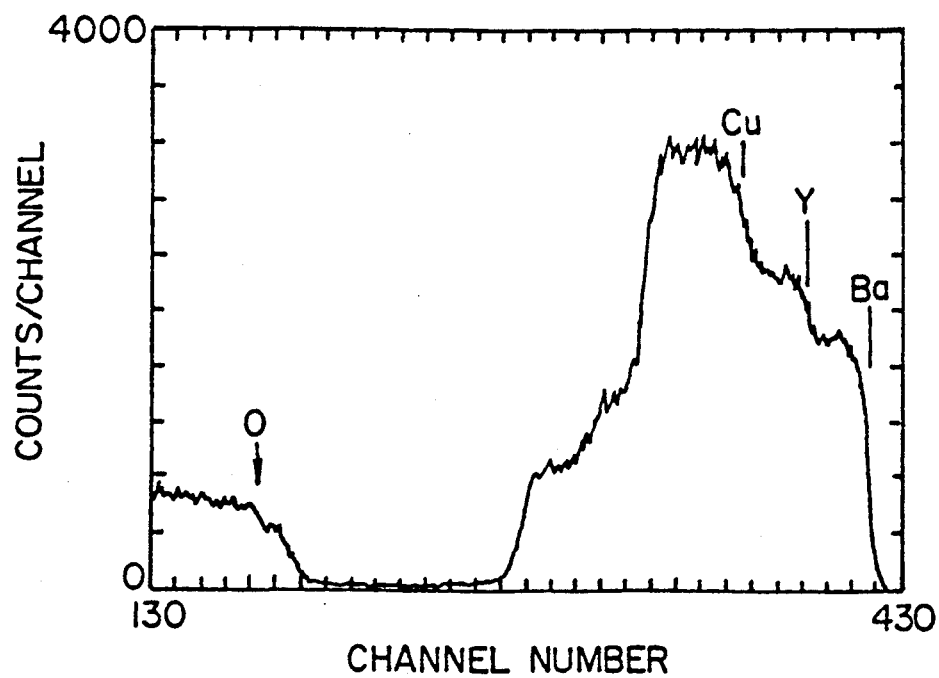
FIG._2.

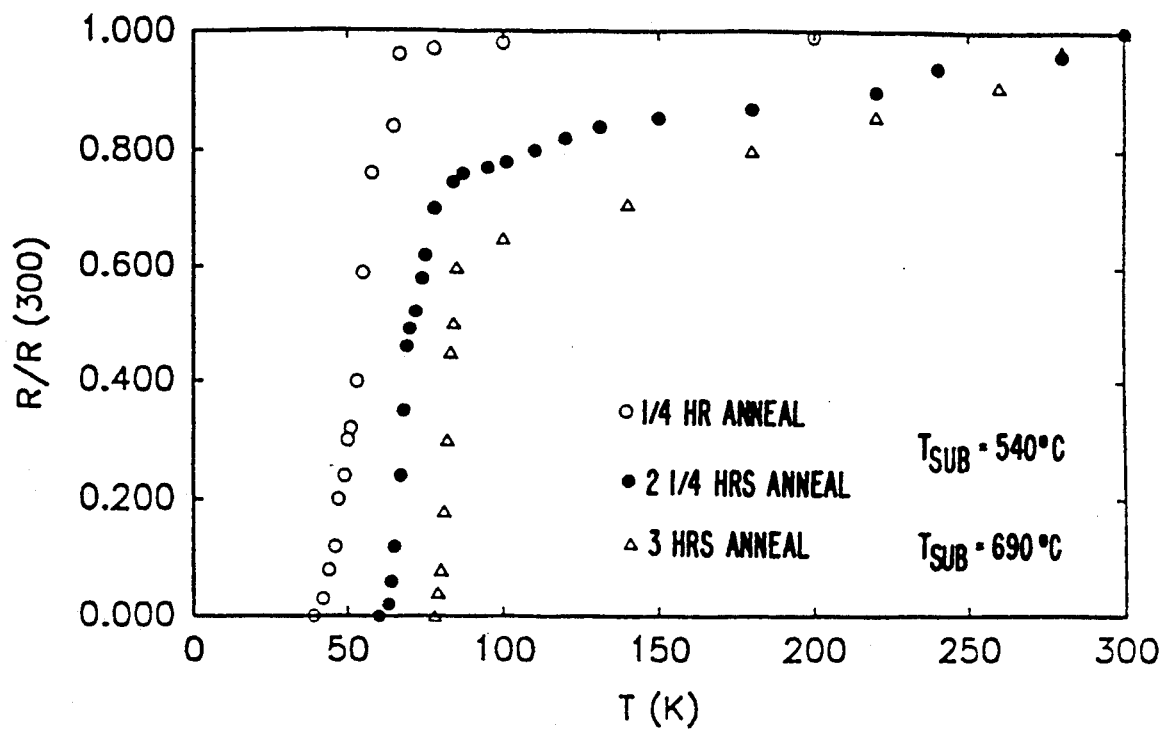
FIG._3.
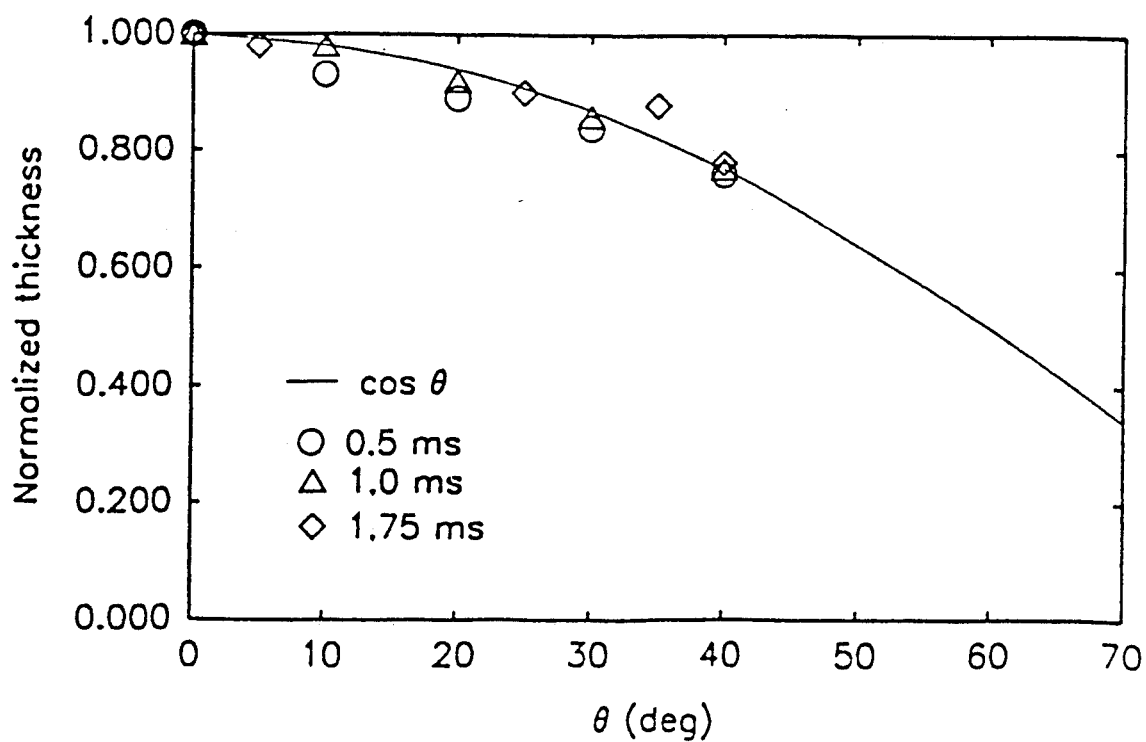
FIG._4.

LONG-LASER-PULSE METHOD OF PRODUCING THIN FILMS

The invention described herein arose in the course of, or under, Contract No. DE-C03-76SF0098 between the United States Department of Energy and the University of California.

BACKGROUND OF THE INVENTION

This invention relates in general to techniques for producing thin films, and in particular to a method of using pulsed laser to deposit high temperature superconducting thin films.

Ever since the recent discovery of high $T_c$ superconductor materials, considerable effort has been expended to provide practical methods for making such materials. At this time, the only forms with practical application are thin films, which may be used in certain instruments such as SQUIDS and bolometers. Another application contemplated is fabrication of general purpose superconductors in the form of thin films deposited on wires or tapes. However, present techniques for producing thin films are generally very costly and very difficult to reproduce.

Of the many techniques for producing thin films from high $T_c$ superconducting ceramics, pulse-laser deposition has provided excellent films with narrow resistance transition widths and high critical currents As currently practiced, the technique employs a series of very short (nanosecond duration) pulses, principally from excimer lasers to ablate the surface of bulk superconducting material and to deposit the material as a thin film onto a substrate. The peak power densities of the laser irradiation are in the range $10^7$–$10^9$ W/cm$^2$, in which case laser-vapor interaction may occur and the blowoff may contain high-energy ions as well as neutral species.

One critical consideration in deposition of high-$T_c$ superconducting films is the requirement for congruent vaporization of the constituent atoms in the superconducting material such that the proper metal-atom ratios are preserved in the film. Maintaining the original material's stoichiometry during vaporization is essential for preserving the superconducting structure and ensures a sharp transition temperature and a high current density. It is generally believed that the combination of high power density and low deposition rate (a few Angstrom per pulse at most) per pulse obtainable from short-pulse (nanosecond duration) excimer lasers is necessary for achieving congruent vaporization. The reasoning is that such a short pulse will provide a shock mechanism for dislodging the constituent atoms rather than relying on equilibrium thermal processes, which may lead to non-congruent vaporization.

Although high quality films can be produced by short-pulsed lasers, practical industrial application is problematic. First, the narrow angular distribution in the vapor blowoff makes deposition of uniform thickness films over large substrate areas difficult. Typically the angular distribution of the emitted material is non-diffuse, with functional forms as peaked as $\cos^8\Phi$ or even $\cos^{11}\Phi$ (where $\Phi$ is the emission angle relative to the normal of the film surface). This amounts to a 25% reduction in thickness outside a cone of angle 10–15°. Secondly, the throughput is small with a deposition rate of approximately 1 Å per pulse. About $10^3$ pulses are required to deposit a film of 0.1 μm thickness, which can take approximately 30 minutes. Thirdly, the initial laser cost and maintenance expenses are high.

With the low deposition rate for short-pulse lasers, any lower peak power density irradiation will be impractical. For example, nanosecond-wide pulses with a repetition rate of ~1Hz and peak power density of $10^5$–$10^6$ W/cm$^2$ simply is ineffective in producing sufficient vaporization to deposit a film in a reasonable period of time.

Longer pulse lasers would provide faster deposition rates; however, it was generally believed that they will lead to non-congruent vaporization, and therefore the deposited films would not have the correct stoichiometry needed for superconductivity.

SUMMARY OF THE INVENTION

The present invention provides a method of depositing a thin film by means of a laser with a lower peak power density typically ($10^5$–$10^6$ W/cm$^2$) and a much longer pulse width (millisecond range) than the short-pulse laser described in the preceding section. The lower peak power density leads to a much lower vaporization rate, reduces ionization of the vapor, and avoids strong laser-vapor interactions. Because of the relatively low laser power density, the vaporization process tends to be in the near-thermal equilibrium regime. This has the advantage of exhibiting much less variation (cos $\Phi$) in film thickness with angle of deposition. This amounts to a 25% reduction in thickness outside a cone of angle ~40°. Consequently a much larger area may be deposited. In addition, the composition of the vapor flux is independent of the angle from the normal; in contrast, strong angular variations in composition are observed with short-pulse laser vaporization.

The much lower vapor flux rate (two orders of magnitude less than the ns pulse technique) is more than offset by the much longer duration in which the power is applied. Long-pulse (ms) vaporization provides approximately two to three orders of magnitude increase in time-averaged deposition rate.

Experiments utilizing the long-pulse laser vaporization method have demonstrated that the ratios of the metal species in the film is very close to that in the original material (i.e., stoichiometry is maintained, contrary to previous expectations).

According to one aspect of the present invention, a low-peak-power density, long-pulse laser is used to vaporize material to be deposited onto a substrate in a vacuum chamber. The substrate is held at elevated temperature to promote in situ recrystallization of the deposited film.

According to another aspect of the present invention the vapor is supplemented by a local supply of oxidizing agent to replenish any deficiency of oxygen in the films arising from the vaporization and deposition process.

According to yet another aspect of the present invention, additional post-annealing is performed on the deposited film held at elevated temperature in an oxidizing atmosphere.

Additional objects, features and advantages of the present invention will become apparent from the following description of a preferred embodiment thereof, which description should be taken in conjunction with the accompanying drawings.

DETAILED DESCRIPTION OF THE DRAWINGS

FIG. 1 is a schematic view of an apparatus suitable for practicing an embodiment of the invention;

FIG. 2 is a graph illustrating the stoichiometry of the $YBa_2Cu_3O_7$ film deposited by the method of the present invention, as measured by Rutherford backscattering spectra;

FIG. 3 is a graph illustrating the resistance vs temperature of films deposited on $SrTiO_3$ substrates for different substrate temperatures and annealing times;

FIG. 4 is a graph illustrating the angular dependence of the deposited film thickness with respect to the target normal for different laser pulse widths;

FIG. 5 is a graph illustrating the composition variation of the deposited film with angle for vaporization with pulses 1 ms long.

DETAILED DESCRIPTION OF THE INVENTION

Referring to FIG. 1, a target 10 of bulk superconducting material and a substrate 20 on which a thin film of superconducting material is to be deposited are placed in a vacuum chamber 30. The target 10 is irradiated by a laser 40, which beam is focused by a lens 42 and reaches the target 10 through a window 44 of the vacuum chamber 30.

In contrast to the higher peak power density and short (nanosecond duration) pulse lasers used in conventional laser deposition techniques, the operating parameters of the laser employed in the present invention are several order of magnitudes different. It has a much lower peak power density (typically in the range $10^5$–$10^6$ W/m² and extending to as low as $10^4$ W/m²) and a much longer pulse width (in the millisecond range) An example of such a long pulse laser suitable for use in the present invention is a Nd-glass laser with a wavelength of 1.06 micrometers. The laser can deliver 50 Joules of pulse energy and produces approximately triangular pulses with baseline widths of 0.5 to 2.0 milliseconds. The beam is focused to a spot of approximately 4.5 mm in diameter on the target 10 by means of the lens 42.

The target 10 is a pellet of sintered and hot isostatically-pressed high-$T_c$ superconducting material such as $YBa_2Cu_3O_7$. Other examples of high-$T_c$ superconducting materials are Yttrium-based, Bismuth-based and Thallium-based. It is the usual practice in preparing superconducting material to use the process of sintering by which oxides of the constituents in powder form are compacted and heated to a high temperature to form a dense ceramic substance. In the present invention, it is preferable to have high-density targets whereby the chance of cracking by the laser beam is minimized. High-density targets may be formed by the hot isostatic-pressing process, in which pressure is applied in conjunction with heat. The target must also be prepared relatively free from carbon contamination, as is the case with other laser deposition techniques.

Some targets function quite well at room temperatures, but others are susceptible to thermal-shock cracking upon laser bombardment. To minimize this effect, the target 10 can be held at elevated temperatures by electron bombardment provided by an electron beam heater 50. The target is preferably kept at a high temperature to the point where the material has some plasticity, but not so high as to cause substantial loss of oxygen from the material. The target's temperature may be measured by an optical pyrometer 52 through a window 54 of the vacuum chamber 30. The optical pyrometer may also be used to monitor the surface temperature of the target during laser vaporization.

The substrate 20 is located in the vacuum chamber 30 about 5 cm from the target. The substrate 20 is also kept at elevated temperature in the range 500–800° C by a substrate heater 60 such as a hot kanthal or PtRh filament heater. This allows in situ mixing and recrystallization of the components of the superconducting material as the material is being deposited on the substrate. The substrate temperature can be measured by a thermocouple (not shown).

During operation, the vacuum chamber 30 is evacuated to a background pressure of approximate $10^{-7}$ Torr by a diffusion pump (not shown). The target is vaporized by the laser and the vapor is deposited on the substrate as a thin film. Some oxygen in the original superconducting material is likely to be lost. The predominantly molecular oxygen emitted from the target by laser heating has a lower sticking probability on ceramics and is thus not as readily incorporated into the growing films as the metal-bearing species. In order to retain the proper oxygen ratio in the superconducting film being deposited, additional oxygen is introduced close to the depositing film in the vacuum chamber 30. The additional supply of oxygen is delivered by a small doser 70, which provides oxygen close to the substrate at an equivalent pressure about $10^3$ times larger than the background pressure of the vacuum chamber. A 300 W rf discharge 72 is generated at the end of the doser containing oxygen at a pressure of 200 milliTorr. The doser is intended to deliver excited oxygen molecules and atoms, which should be more reactive on the substrate and better able to replenish oxygen lost in the vaporization process. In place of oxygen, other oxidizing agents, such as halogen gases, may also be used.

In cases when the oxygen discharging operation with the doser 70 is insufficient to replenish the lost oxygen, an additional post-annealing operation is needed. In one embodiment, after the film has been deposited on the substrate, it is removed from the vacuum chamber and placed in a separate furnace for annealing. The annealing is performed at elevated temperature in an atmosphere of an oxidizing agent such as oxygen or other halogen gas for a predetermined period of time. The optimum temperature and annealing time may be determined by the best quality film obtained. In the case of $YBa_2Cu_3O_7$ thin film, the annealing temperature is in the range between 700° C. and 900° C.

EXAMPLE I

Each pulse laser irradiation of 0.5 ms duration with a peak power density of $\sim 3 \times 10^6$ W/cm² produced a film $\sim 100$ nm thick on a quartz substrate at 500° C. For these laser conditions, the maximum $YBa_2Cu_3O_7$ surface temperature was measured to be $\sim 3800°$ K with no preheating (assuming a blackbody for purposes of pyrometer signal interpretation). For four laser pulses of 0.5 ms width and $2 \times 10^6$ W/cm² peak power density a crater 4.5 mm in diameter and 1.5 mm deep, flat at the bottom, was generated in the target. The Rutherford backscattering (RBS) spectrum in FIG. 2 showed a 360-nm-thick film with an Y:Ba:Cu ratio of 1.0:2.0:3.2, in good agreement with Energy dispersive X-ray analysis (EDAX). The films showed excellent adherence to the substrate and negligible compositional and thickness variations across the quartz substrate, which is approximately 1 cm in diameter.

EXAMPLE II

The films were deposited on polished and cleaned $SrTiO_3$ substrates. The $SrTiO_3$ substrate was coated (with the oxygen discharge operating) by the vapor from four 1-ms-duration laser pulses of peak power density $1 \times 10^6$ W/cm$^2$. The substrate temperature during deposition was 540° C. The film was annealed in a separate furnace in oxygen at 850° C for 15 min. Another film was annealed for 2¼ hours. Yet another film which substrate temperature was increased to 690° C during deposition was annealed for 3 hours. In all cases the sample was brought back to room temperature overnight. Film resistance versus temperature was measured by the standard 4-point-probe method. FIG. 3 shows the resistance versus temperature for three films with different substrate temperature and post annealing conditions. For a substrate temperature of 540° C and a post-annealing time of about 15 minutes at 850° C, the onset of superconductivity was about 65 K and zero resistance was achieved at about 42° K. With the additional 2 hours annealing, these temperatures were raised to 78° and 61° K, respectively. Prolonging the annealing time beyond three hours had no appreciable effect on the transitions. However, raising the substrate temperature during deposition to 690° C and annealing for three hours raised these temperatures to 85° K and 79° K, respectively. The improvement of the quality of the film as a result of increase in substrate temperature suggests that interdiffusion of the metal species in the film during deposition plays an important role in obtaining the desired crystal structure.

EXAMPLE III

The angular compositional and thickness dependences of films were obtained by mounting small pieces of silicon in an arc with a radius of curvature of 5 cm and with the center above the laser beam spot on the target. The Si surfaces were partially masked by a photoresist. After the removal of the photoresist, the thickness of the films was measured by a profilameter. FIG. 4 shows the thickness variation as a function of angle for three different laser pulse widths of 0.5, 1.0 and 1.75 ms. The variation in thickness clearly suggests a cosine angular distribution for all three laser pulse widths. The films were also examined by RBS for the 1 ms pulse duration experiment FIG. 5 shows no significant change in composition up to about 40° with respect to the normal of the target.

Although the various aspects of the present invention have been described with respect to its preferred embodiments, it will be understood that the invention is to be limited only by the scope of the appended claims.

What is claimed is:

1. A method of depositing a thin film of a superconducting ceramic material on a substrate by laser evaporation, comprising the steps of:
   providing a solid target of the material and the substrate spaced therefrom in an evacuated chamber;
   maintaining the substrate at a first predetermined elevated temperature;
   vaporizing a portion of the material from the target by a laser beam having a peak power density in the range between $10^5$–$10^6$ W/cm$^2$ and a pulse width in the range between 0.5 to 2.0 milliseconds; and
   forming the a thin film of the superconducting ceramic material on the substrate from the vaporized target material.

2. The method as in claim 1, further comprising:
   providing a predetermined metered amount of reactive oxidation agent adjacent to the surface of the substrate to be coated, the oxidizing agent being added to replenish depletion in the film; and
   forming the thin film on the substrate from the vaporized target material and the oxidizing agent.

3. The method as in claim 2, wherein the reactive oxidizing agent is excited oxygen molecules or atoms.

4. The method as in claim 2, wherein the reactive oxidizing agent is excited halogen molecules or atoms.

5. The method as in claim 1, further comprising:
   maintaining the target at an elevated temperature sufficient to avoid thermal-shock cracking prior to the step of vaporizing the target by a laser beam.

6. The method as in claim 1, further comprising:
   exposing the thin film to an additional oxidizing agent; and
   annealing the thin film at a second predetermined elevated temperature for a time sufficient to yield optimum film quality.

7. The method as in claim 1, wherein the solid target is a pellet of pressure-sintered or hot isostatically-pressed superconducting ceramic material.

8. The method as in claim 7, wherein the superconducting ceramic material is chosen from the group consisting of Yttrium-based, Bismuth-based and Thallium-based high-$T_c$ superconducting materials.

9. The method as in claim 8, wherein the superconducting ceramic material is $YBa_2Cu_3O_7$.

10. The method as in claim 9, further comprising:
    providing a predetermined metered amount of reactive oxidizing agent adjacent to the surface of the substrate to be coated, the oxidizing agent being added to replenish depletion of oxygen in the film; and
    forming the thin film on the substrate from the vaporized target material and the oxidizing agent.

11. The method as in claim 10, wherein the reactive oxidizing agent is excited oxygen molecules or atoms.

12. The method as in claim 10, wherein the reactive oxidizing agent is excited halogen molecules or atoms.

13. The method as in claim 10, further comprising:
    maintaining the target at an elevated temperature sufficient to avoid thermal-shock cracking prior to the step of vaporizing the target by a laser beam.

14. The method as in claim 10, further comprising:
    exposing the thin film to an additional oxidizing agent; and
    annealing the thin film at a second predetermined elevated temperature for a time sufficient to yield optimum film quality.

15. The method as in claim 14, wherein the second predetermined elevated temperature of the substrate is in the range between 700° C and 900° C.

16. The method as in claim 14, wherein the first predetermined elevated temperature of the substrate is in the range between 500° C and 800° C.

17. The method of coating a thin film of a superconducting material on a substrate by laser evaporation, comprising the steps of:
    providing a solid target of the material and the substrate spaced therefrom in an evacuated chamber;
    maintaining the substrate at a first predetermined elevated temperature;

vaporizing a portion of the material from the target by a laser beam having a long width and a low peak power density less than $5 \times 10^6$ W/cm$^2$ such that vaporization is substantially close to thermal equilibrium, thereby maintaining the vaporized target material at substantially the stoichiometry of the solid target; and forming the thin film on the substrate from the vaporized target material.

18. The method as in claim 17, further comprising:

providing a predetermined metered amount of reactive oxidation agent adjacent to the surface of the substrate to be coated, the oxidizing agent being added to replenish depletion of oxygen in the film; and forming the thin film on the substrate from the vaporized target material and the oxidizing agent.

19. The method as in claim 18, wherein the reactive oxidizing agent is excited oxygen molecules or atoms.

20. The method as in claim 18, wherein the reactive oxidizing agent is excited halogen molecules or atoms.

21. The method as in claim 17, further comprising:
maintaining the target at an elevated temperature sufficient to avoid thermal-shock cracking prior to the step of vaporizing the target by a laser beam.

22. The method as in claim 17, further comprising:
exposing the thin film to an additional oxidizing agent; and
annealing the thin film at a second predetermined elevated temperature for a time sufficient to yield optimum film quality.

23. The method as in claim 17, wherein the solid target is a pellet of pressure-sintered or hot isostatic-pressed superconducting material.

24. The method as in claim 23, wherein the superconducting material is chosen from the group consisting of Yttrium-based, Bismuth-based and Thallium-based high-$T_c$ superconducting materials.

25. The method as in claim 24, wherein the superconducting material is $YBa_2Cu_3O_7$.

* * * * *